United States Patent
Gowda et al.

(10) Patent No.: US 9,066,443 B2
(45) Date of Patent: Jun. 23, 2015

(54) OVERLAY CIRCUIT STRUCTURE FOR INTERCONNECTING LIGHT EMITTING SEMICONDUCTORS

(75) Inventors: Arun Virupaksha Gowda, Rexford, NY (US); Donald Paul Cunningham, Dallas, TX (US); Shakti Singh Chauhan, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 606 days.

(21) Appl. No.: 13/231,547

(22) Filed: Sep. 13, 2011

(65) Prior Publication Data

US 2013/0062630 A1    Mar. 14, 2013

(51) Int. Cl.
| | |
|---|---|
| H01L 33/00 | (2010.01) |
| H05K 1/18 | (2006.01) |
| H01L 25/075 | (2006.01) |
| H01L 33/62 | (2010.01) |
| H01L 33/64 | (2010.01) |
| H05K 1/02 | (2006.01) |

(52) U.S. Cl.
CPC ............ *H05K 1/189* (2013.01); *H01L 25/0753* (2013.01); *H01L 33/62* (2013.01); *H01L 33/642* (2013.01); *H01L 33/647* (2013.01); *H05K 1/021* (2013.01); *H01L 2933/0066* (2013.01); *H05K 2201/10106* (2013.01); *H01L 2224/24* (2013.01)

(58) Field of Classification Search
CPC ................................ H01L 33/62; H01L 33/64
USPC ........................ 257/88, 99, E33.075
See application file for complete search history.

(56) References Cited

U.S. PATENT DOCUMENTS

| | | | |
|---|---|---|---|
| 5,886,401 A * | 3/1999 | Liu | ............................... 257/678 |
| 2003/0020081 A1 | 1/2003 | Guida | |
| 2007/0231560 A1 | 10/2007 | Zhang et al. | |
| 2007/0240310 A1 | 10/2007 | Zhang et al. | |
| 2008/0019097 A1 | 1/2008 | Zhang et al. | |
| 2009/0278139 A1 | 11/2009 | Fjelstad | |
| 2012/0235172 A1 | 9/2012 | Roberts | |
| 2013/0039013 A1 | 2/2013 | Waegli et al. | |
| 2013/0213697 A1* | 8/2013 | Palaniswamy et al. | ........ 174/254 |

FOREIGN PATENT DOCUMENTS

WO        2012112873 A2        8/2012

* cited by examiner

*Primary Examiner* — Thien F Tran
(74) *Attorney, Agent, or Firm* — Ziolkowski Patent Solutions Group, SC; Jean K. Testa

(57) ABSTRACT

A system and method for packaging light emitting semiconductors (LESs) is disclosed. An LES device is provided that includes a heatsink and an array of LES chips mounted on the heatsink and electrically connected thereto, with each LES chip comprising connection pads and a light emitting area configured to emit light therefrom responsive to a received electrical power. The LES device also includes a flexible interconnect structure positioned on and electrically connected to each LES chip to provide for controlLES operation of the array of LES chips, with the flexible interconnect structure further including a flexible dielectric film configured to conform to a shape of the heatsink and a metal interconnect structure formed on the flexible dielectric film and that extends through vias formed in the flexible dielectric film so as to be electrically connected to the connection pads of the LES chips.

26 Claims, 4 Drawing Sheets

US 9,066,443 B2

OVERLAY CIRCUIT STRUCTURE FOR INTERCONNECTING LIGHT EMITTING SEMICONDUCTORS

BACKGROUND OF THE INVENTION

Embodiments of the invention relate generally to structures and methods for packaging light emitting semiconductor devices and, more particularly, to a flexible overlay circuit structure for interconnecting light emitting semiconductor devices.

Power semiconductor devices are semiconductor devices used as switches or rectifiers in power electronic circuits, such as switched mode power supplies, for example. Most power semiconductor devices are only used in commutation mode (i.e., they are either on or off), and are therefore optimized for this. One such device is a semiconductor light emitting device, with a prominent example being a light emitting diode (LED). LEDs are semiconductor chips that are packaged to emit radiation in response to an applied voltage or current. These LEDs are used in a number of commercial applications such as automotive, display, safety/emergency, and directed area lighting. LEDs may be fabricated using any materials which emit visible, ultra-violet, or infrared radiation. Currently, LEDs are typically assembled onto insulated metal substrates. The insulated metal substrates (IMS) include a metal baseplate (e.g., aluminum baseplate) covered by a thin layer of dielectric material (e.g., an epoxy-based layer) and a layer of copper, with the baseplate then being attached to a heatsink to provide cooling. One face of the LED chip/die is then typically soldered or silver adhesive attached to the IMS copper and the other terminal/face wirebonded to the IMS. Alternatively, the LED chip can be packaged in a first level package which can then be soldered to the IMS. In this first level package, one face of the LED chip is soldered or silver die attached to a pad on a substrate (metalized ceramic or polymer) and the other terminal/face is attached via wirebond to another pad on the same substrate. This first package may optionally include heat slugs.

It is recognized, however, that there are several drawbacks to the existing method of assembling arrays of LEDs on an IMS and of the wirebonding of the LED chips/dies to the IMS. For example, it is known that LEDs may be fabricated for use in a variety of products that have a curved surface or shape, including lighting products such as round lamp bulbs, flood lights, cylindrical flashlights, etc. In such products, it can be difficult to wirebond the LED chips/dies to a curved surface IMS. As another example, it is recognized that the form factor of the IMS limits applications or implementations of an array of LEDs to use only as a directional light source, when it may be desirable for the array of LEDs to be applied or implemented in more complex shapes, such as shapes typical in general incandescent lighting. As yet another example, it is recognized that layer of dielectric material in the IMS can add unnecessary thermal resistance that may negatively impact the performance and/or efficiency of the array of LEDs.

Accordingly, it is desirable to provide a semiconductor light emitting device package that is freed from the constraints and drawbacks associated with mounting on a standard IMS. It is further desirable for such a semiconductor light emitting device package to be adaptable and conformable to a plurality of complex shapes and eliminate the limitations associated with wirebonds.

BRIEF DESCRIPTION OF THE INVENTION

Embodiments of the invention overcome the aforementioned drawbacks by providing a flexible interconnect structure for connecting an array of light emitting semiconductor chips.

In accordance with one aspect of the invention, a light emitting semiconductor (LES) device includes a heatsink and an array of LES chips mounted on the heatsink and electrically connected thereto, each LES chip comprising a front surface and a back surface with the front surface including a light emitting area configured to emit light therefrom responsive to a received electrical power and with at least one of the front surface and the back surface including a connection pads thereon. The LES device also includes a flexible interconnect structure positioned on and electrically connected to each LES chip to provide for controlled operation of the array of LES chips, with the flexible interconnect structure further including a flexible dielectric film configured to conform to a shape of the heatsink and a metal interconnect structure formed on the flexible dielectric film, with the metal interconnect structure extending through vias formed through the flexible dielectric film so as to be electrically connected to the connection pads of the LES chips.

In accordance with another aspect of the invention, a multidirectional lighting device includes a heatsink having a curved profile and an array of light emitting semiconductor (LES) chips affixed to the heatsink so as to be electrically connected thereto, with the array of LES chips being arranged so as to have a curved profile that substantially matches that of the heatsink, and wherein each LES chip comprises a front surface including a connection pad and a light emitting area configured to emit light therefrom responsive to a received electrical power. The multidirectional lighting device also includes a flexible interconnect structure positioned on the array of LES chips and being electrically connected to each of the LES chips, with the flexible interconnect structure further including a flexible dielectric film configured to conform to the curved profile of the array of LES chips and a metal interconnect structure formed on the flexible dielectric film, the metal interconnect structure extending through vias formed through the flexible dielectric film so as to be electrically connected to the connection pads of the LES chips.

In accordance with yet another aspect of the invention, a method of forming a light emitting semiconductor (LES) device includes providing a plurality of LES chips forming an LES array and connecting a flexible dielectric film to each of the plurality of LES chips in the LES array, with the flexible dielectric film configured to flex so as to conform substantially to the profile of the LES array. The method also includes forming a metal interconnect structure on the flexible dielectric film to electrically connect the plurality of LES chips, with the metal interconnect structure extending through vias in the flexible dielectric film so as to be electrically connected to contact pads of the LES chips. The method further includes securing the plurality of LES chips to a heatsink such that the plurality of LES chips is electrically connected to the heatsink and such that the LES array has a profile that matches a profile of the heatsink.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings.

DETAILES DESCRIPTION

Embodiments of the present invention provide for a light emitting semiconductor (LES) device having a flexible interconnect structure. The flexible interconnect structure provides for the arrangement of an array of LES chips in various complex shapes, with the flexible interconnect structure being configured to conform around such complex shapes will still providing a robust interconnect to the LES chips. The flexible interconnect structure eliminates the need for traditional insulated metal substrates (IMS) and wirebonds in an LES device. According to embodiments of the invention, the LES device may incorporate light emitting diode (LED) chips or other suitable non-diode type light emitting semiconductor chips, and all such embodiments are considered to be within the scope of the invention.

Figure 1:
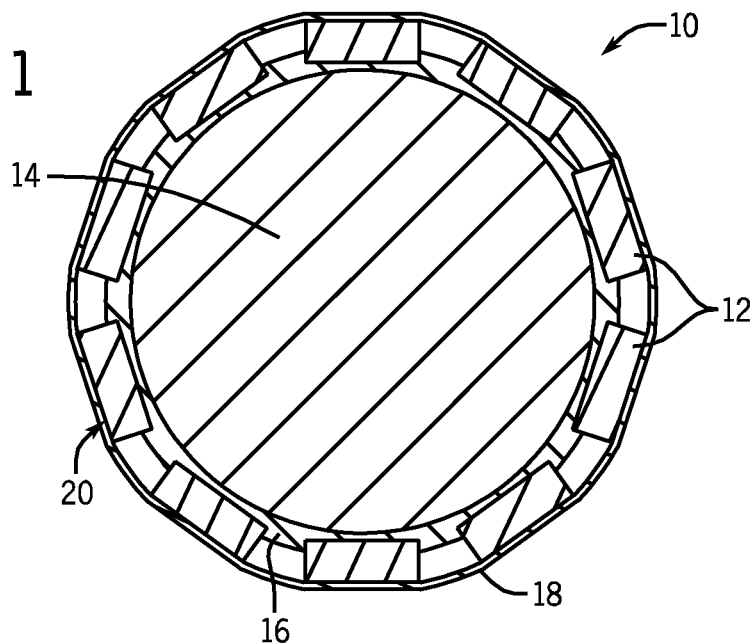
FIG. 1 is a cross-sectional view of a light emitting semiconductor (LES) device including an array of LES chips and a flexible interconnect structure positioned around a cylindrical heatsink according to an embodiment of the invention.

Referring to FIG. 1, a light emitting semiconductor (LES) device 10 is shown according to an embodiment of the invention. The LES device 10 includes an array of LES chips or dies 12 arranged in a specified pattern and shape to provide a desired illumination coverage to be generated by LES device 10. According to an exemplary embodiment of the invention, the LES chips 12 are in the form of light emitting diode (LED) chips, although it is recognized that the LES chips 12 could also be in the form of other suitable non-diode type light emitting semiconductor chips. The array of LES chips 12 can be arranged in a cylindrical fashion, as illustrated in FIG. 1, to provide a multidirectional lighting device, or can be arranged in any other desired fashion/pattern. According to the embodiment shown in FIG. 1, LES device 10 is in the form of a multidirectional lighting device that provides illumination over a 360 degree area or range (i.e., LES chips 12 are positioned/arranged to emit light over a 360 degree area), such that LES device 10 is constructed/configured similar to an incandescent bulb type lighting device, for example. It is recognized, however, that the array of LES chips 12 can be provided in any number of arrangements, such as might be found in round lamp bulbs, flood lights, or cylindrical flashlights. As shown in FIG. 1, the array of LES chips 12 are positioned about a heatsink 14 and are secured thereto by way of a solder or silver epoxy layer 16, for example. The heatsink 14 can be formed of aluminum or another suitable material to provide cooling to the array of LES chips 12 by drawing heat away therefrom that is generated during operation of the LES device 10. The heatsink 14 can also include fins or channels through which air or liquid can be passed through to enhance the cooling.

In addition to acting as a cooling mechanism, heatsink 14 also forms part of either a cathode or anode of the LES device, depending on the configuration of LES device 10, and thereby functions as either a cathode or anode connection for LES chips 12. That is, as LES chips 12 are directly attached to heatsink 14 (by way of solder/silver epoxy layer 16) without the inclusion of a dielectric layer therebetween (e.g., insulated metal substrate), such as in the prior art device of FIG. 1, the heatsink 14 can function as either a cathode or anode connection.

Also included in LES device 10 is a flexible interconnect structure 18 that functions to provide for controlLES operation of the array of LES chips 12. The flexible interconnect structure 18 is formed on an outward facing surface of LES device 10, on a front surface 20 of LES chips 12 from which light is emitted during operation of the LES device. The flexible interconnect structure 18 generally conforms to the shape/pattern in which the array of LES chips 12 are arranged. Thus, as seen in FIG. 1 for example, the flexible interconnect structure 18 has a generally circular/cylindrical profile that matches that of the array of LES chips 12 mounted on the cylindrically shaped heatsink 14.

Figure 2:
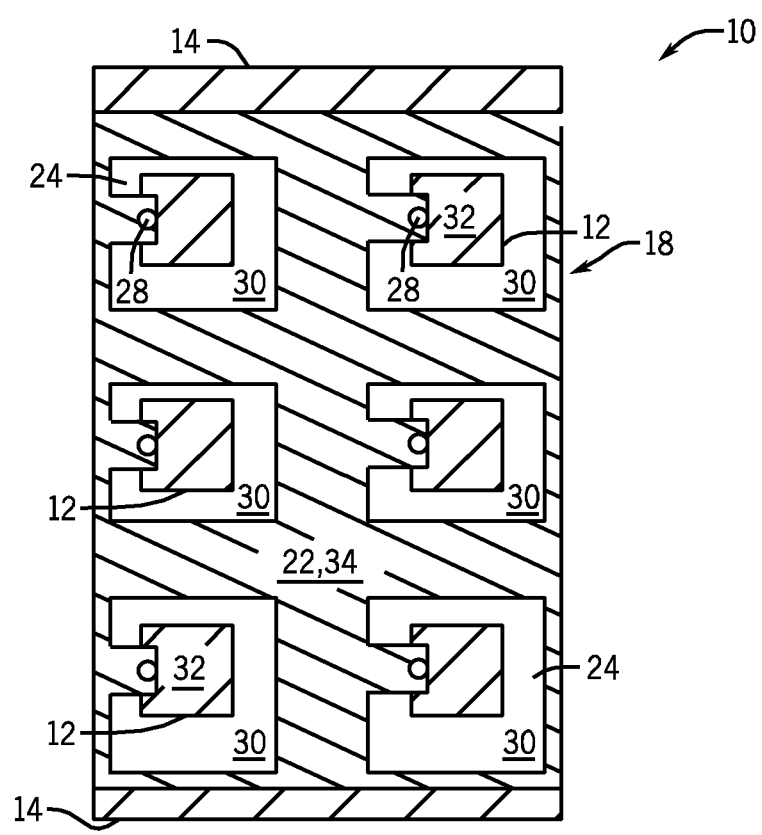
FIG. 2 is a plan view of a portion of the LES device of FIG. 1 looking radially inward according to an embodiment of the invention.
Figure 3:
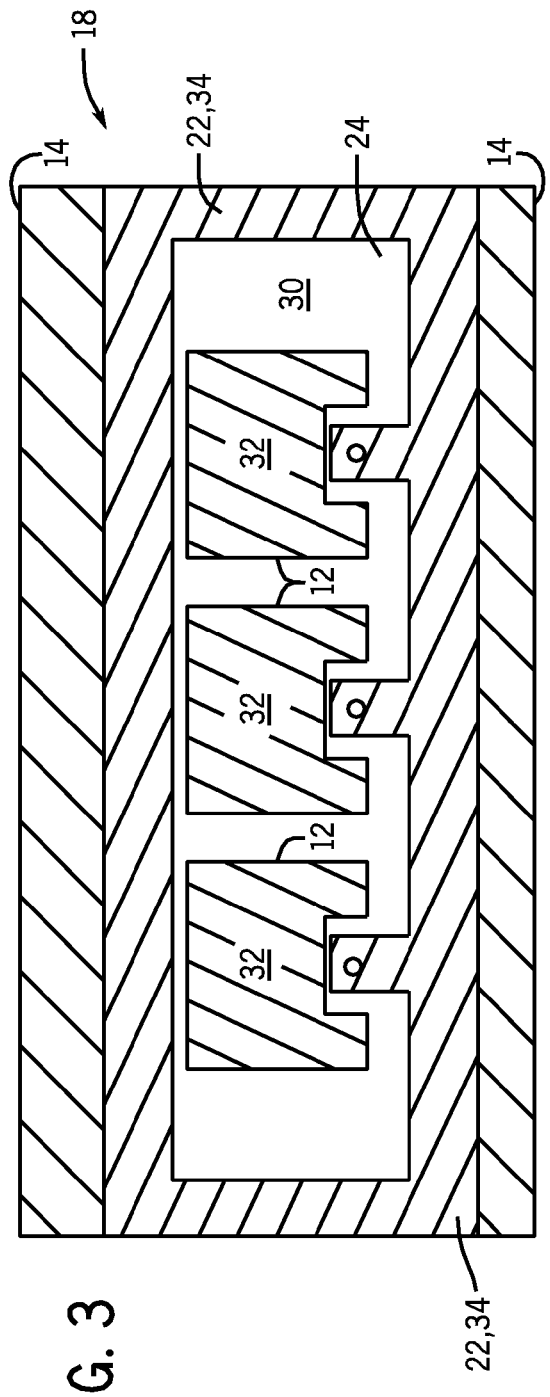
FIG. 3. is another plan view of a portion of the LES device of FIG. 1 according to an embodiment of the invention.
Figure 4:
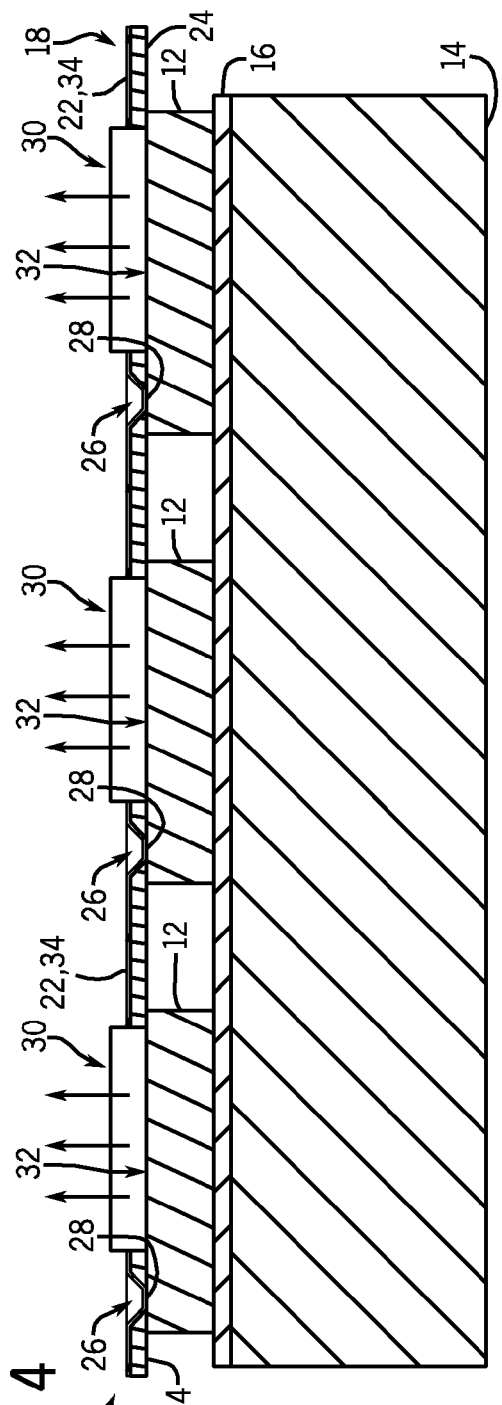
FIG. 4 is a schematic cross-sectional view of an LES chip and flexible interconnect structure of the LES device of FIG. 1 according to an embodiment of the invention.

A more detaiLES view of flexible interconnect structure 18 is provided in FIGS. 2-4. As shown therein, flexible interconnect structure 18 includes a plurality of metal interconnects 22 (i.e., copper traces) formed and patterned onto a flexible film 24. According to an embodiment of the invention, the flexible film 24 is composed of a dielectric material and may be formed of such materials as polyimides, epoxies, paralyene, silicones, etc. According to one embodiment, flexible film 24 is in the form of a pre-formed laminate sheet or film that is formed of Kapton®, Ultem®, polytetrafluoroethylene (PTFE), Upilex®, polysulfone materials (e.g., Udel®, Radel®), or another polymer film, such as a liquid crystal polymer (LCP) or a polyimide material. Thus, in one embodiment of the invention, flexible film 24 may be formed/provided to have adhesive properties, so as to adhere directly to each LES chip 12 in the array. However, it is recognized that, alternatively, a separate adhesive layer (not shown) may be included between the flexible dielectric film 24 and the array of LES chips 12 to adhere the components together.

As shown in FIG. 4, the flexible film 24 is selectively patterned to form a plurality of vias 26 therein. The vias 26 are formed at positions corresponding to connection pads (i.e., contact pads) 28 formed on LES chips 12 through which an electrical connection can be made to LES chips 12, so as to expose the connection pads 28. According to one embodiment of the invention, the vias 26 are formed through the flexible film 24 by way of a laser ablation or laser drilling process that is performed subsequent to application of the flexible film 24 onto LES chips 12. Alternatively, the vias/openings 26 may be pre-formed in flexible film 24 by way of a laser ablation or laser drilling process that is performed prior to application thereof onto LES chips 12. According to additional embodiments of the invention, it is also recognized that vias 26 may be formed by way of other methods, including plasma etching, photo-definition, or mechanical drilling processes.

As further shown in FIG. 4, the metal interconnects 22 of flexible interconnect structure 18 are formed along the top surface of flexible film 24 and also formed within each of vias 26 to extend down therethrough to connection pads 28 on the LES chips 12. Metal interconnects 22 thus form direct metallic and electrical connections to connection pads 28. According to one embodiment, metal interconnects 22 are formed by way of applying a metal layer/material, such as via a sputtering or electroplating process, and then subsequently patterning the applied metal material into metal interconnects 22 having a desired shape. According to one embodiment, the metal interconnects 22 are formed by applying a titanium adhesion layer and copper seed layer via a sputtering process, followed by electroplating of additional copper thereon to increase a thickness of the metal interconnects 22 and form copper traces.

As shown in FIGS. 2-4, according to one embodiment of the invention, the metal interconnects 22 and flexible film 24 are both formed and patterned to also include a plurality of openings 30 therein. The openings 30 are formed in flexible interconnect structure 18 in areas adjacent to LES chips 12, with the openings 30 forming windows through which an active area 32 (i.e., light emitting area) on the front surface 20 of LES chips 12 are exposed. The windows/openings 30 can either be left open or filLES with an encapsulant (e.g., silicone) to protect the active areas 32, according to embodiments of the invention. Light emitted from the active area 32 of LES chips 12 is thus permitted to pass through the window 30 of flexible interconnect structure 18 without any interference from flexible film 24 or metal interconnects 22. According an embodiment of the invention, metal interconnects 22 are formed to include a film of reflective material 34 (e.g., aluminum, etc.) coated on an outer surface thereof. The coated film 34 is configured so as to have a high spectral reflectance in the wavelength regime of interest, so as to maximize reflection and reduce optical losses in LES device 10. Optical performance of LES device 10 can thus be improved by inclusion of the reflective film 34 on metal interconnects 22.

Figure 5:
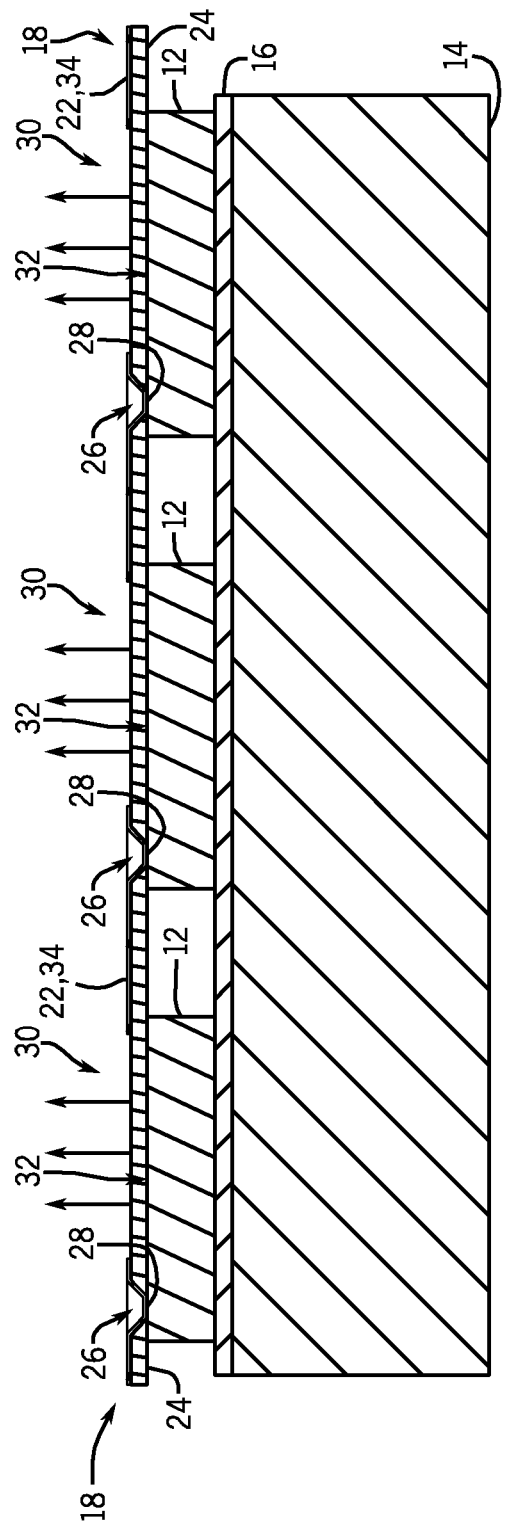
FIG. 5 is a schematic cross-sectional view of an LES chip and flexible interconnect structure of the LES device of FIG. 1 according to another embodiment of the invention.

According to another embodiment of the invention, and as shown in FIG. 5, the flexible film 24 of flexible interconnect structure 18 is provided in the form of a continuous layer, without any openings (such as openings 30) formed therein. In such an embodiment, the flexible film 24 is formed from a transparent dielectric material that permits light to pass therethrough (i.e., high optical transmission). The material from which transparent flexible film 24 should be further selected to match the optical properties of the surrounding medium (i.e., air or silicone encapsulant), so as to minimize reflection at its interface with the surrounding medium. More specifically, transparent flexible film 24 is configured such that total internal reflection (TIR) within the film is avoided, with an angle of incidence being lower than a critical angle so as to avoid TIR.

Thus, light emitted from the active area 32 of LES chips 12 is permitted to pass through the flexible film 24 of flexible interconnect structure 18 without any interference therefrom. According to embodiments of the invention, the transparent flexible film 24 may have adhesive properties, so as to adhere directly to each LES chip 12 in the array. However, it is recognized that, alternatively, a separate transparent adhesive layer (not shown) may be included between the transparent flexible film 24 and the array of LES chips 12 to adhere the components together, with the adhesive having optical properties closely matching that of the transparent film. While flexible film 24 may thus be formed as a continuous layer of dielectric material, it is recognized that the metal interconnects 22 are formed and patterned to form windows/openings in areas adjacent to the active area 32 of LES chips 12, such that the metal interconnects 22 do not interfere with light emitted from the active area 32.

Figure 6:
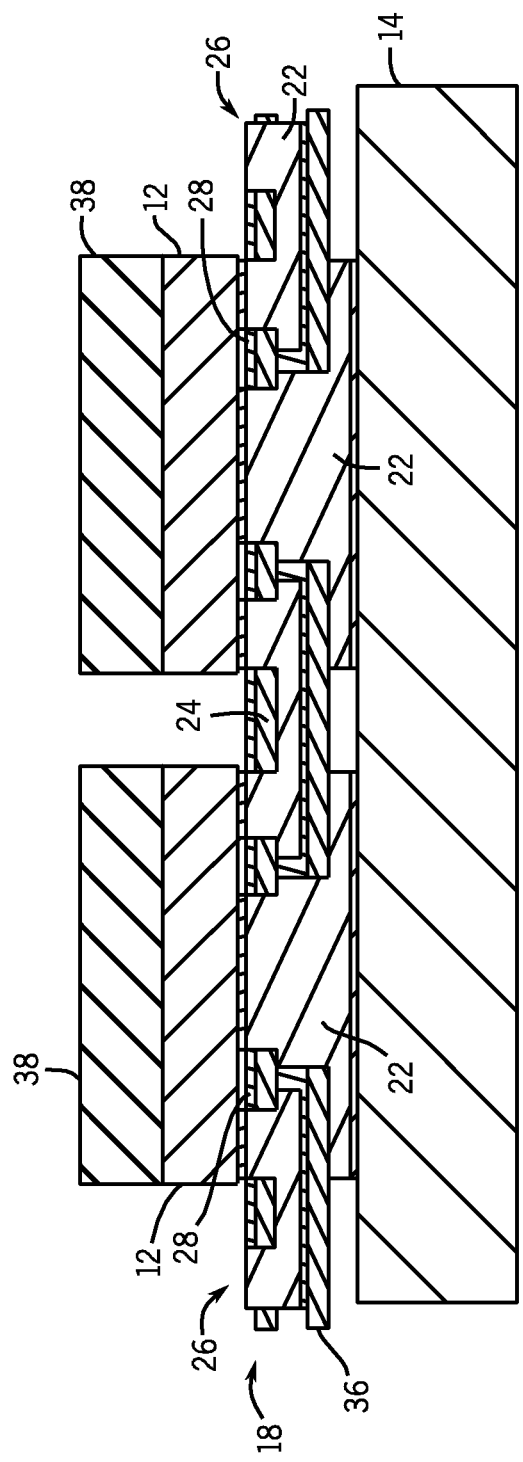
FIG. 6 is a schematic cross-sectional view of an LES chip and flexible interconnect structure of an LES device according to another embodiment of the invention.

Referring now to FIG. 6, an additional embodiment of LES device 10 is shown, where LES chips 12 include contact pads 28 on a backside/back surface thereof, rather than on the front surface. In such an embodiment, flexible interconnect structure 18 is formed along the back surface of the array of LES chips 12 and is positioned between the LES chips 12 and the heatsink 14. Flexible interconnect structure 18 includes metal interconnects 22 formed and patterned onto flexible film 24, with the interconnects extending through vias 26 formed in film 24 so as to extend therethrough to connection pads 28 on the LES chips 12. In the embodiment of FIG. 6, metal interconnects 22 serve as the electrical interconnect with heatsink 14 and also serve as a 'heat spreader' (i.e., thermal re-distribution layer) between the LES chips 12 and the heatsink 14. As shown in FIG. 6, an additional layer 36 is added to interconnect structure 18, such as a second flexible dielectric film layer or a solder mask, in order to provide a double layer POL interconnect structure 18. A silicon encapsulant 38 is positioned on the light emitting surface of LES chips 12 to provide protection thereto.

Beneficially, incorporation of flexible interconnect structure 18 in LES device 10 provides for the arrangement of the array of LES chips 12 in various complex shapes. That is, the flexible interconnect structure 18 can conform around complex shapes, such as shapes typical in general incandescent lighting for example, with the flexible interconnect structure 18 still providing a robust interconnect to the LES chips 12. The flexible interconnect structure 18 also eliminates the need for traditional wirebonds and insulated metal substrates (IMS) in an LES device, thereby providing a low resistance and low inductance interconnects between the LES array 12 and the LES driver electronics. With the elimination of the IMS, thermal resistance in the LES device 10 is reduced, as LES chips 12 are directly mounted onto heatsink 14 without the presence of a dielectric layer therebetween, thus providing an LES device 10 with improved thermal performance and higher lumen output.

Therefore, according to one embodiment of the invention, a light emitting semiconductor (LES) device includes a heatsink and an array of LES chips mounted on the heatsink and electrically connected thereto, each LES chip comprising a front surface and a back surface with the front surface including a light emitting area configured to emit light therefrom responsive to a received electrical power and with at least one of the front surface and the back surface including a connection pads thereon. The LES device also includes a flexible interconnect structure positioned on and electrically connected to each LES chip to provide for controlLES operation of the array of LES chips, with the flexible interconnect structure further including a flexible dielectric film configured to conform to a shape of the heatsink and a metal interconnect structure formed on the flexible dielectric film, with the metal interconnect structure extending through vias formed through the flexible dielectric film so as to be electrically connected to the connection pads of the LES chips.

According to another embodiment of the invention, a multidirectional lighting device includes a heatsink having a curved profile and an array of light emitting semiconductor (LES) chips affixed to the heatsink so as to be electrically connected thereto, with the array of LES chips being arranged so as to have a curved profile that substantially matches that of the heatsink, and wherein each LES chip comprises a front surface including a connection pad and a light emitting area configured to emit light therefrom responsive to a received electrical power. The multidirectional lighting device also includes a flexible interconnect structure positioned on the array of LES chips and being electrically connected to each of the LES chips, with the flexible interconnect structure further including a flexible dielectric film configured to conform to the curved profile of the array of LES chips and a metal interconnect structure formed on the flexible dielectric film, the metal interconnect structure extending through vias formed through the flexible dielectric film so as to be electrically connected to the connection pads of the LES chips.

According to yet another embodiment of the invention, a method of forming a light emitting semiconductor (LES) device includes providing a plurality of LES chips forming an LES array and connecting a flexible dielectric film to each of the plurality of LES chips in the LES array, with the flexible dielectric film configured to flex so as to conform substantially to the profile of the LES array. The method also includes forming a metal interconnect structure on the flexible dielectric film to electrically connect the plurality of LES chips, with the metal interconnect structure extending through vias in the flexible dielectric film so as to be electrically connected to contact pads of the LES chips. The method further includes securing the plurality of LES chips to a heatsink such that the plurality of LES chips is electrically connected to the heatsink and such that the LES array has a profile that matches a profile of the heatsink.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A light emitting semiconductor (LES) device comprising:
 a heatsink;
 an array of LES chips mounted on the heatsink and electrically connected thereto, each LES chip comprising a front surface and a back surface, with the front surface including a light emitting area configured to emit light therefrom responsive to a received electrical power and with at least one of the front surface and the back surface including connection pads thereon; and
 a flexible interconnect structure positioned on and electrically connected to each LES chip to provide for controlled operation of the array of LES chips, the flexible interconnect structure comprising:
  a flexible dielectric film configured to conform to a shape of the heatsink; and
  a metal interconnect structure formed on the flexible dielectric film, the metal interconnect structure extending through vias formed through the flexible dielectric film so as to form direct metallic and electrical connections with the connection pads of the LES chips;
 wherein the heatsink is constructed to have a circular shape such that the array of LES chips mounted thereon are positioned to emit light over a 360 degree area.

2. The LES device of claim 1 wherein the heatsink is constructed to include a plurality of fins or channels configured to allow for air or liquid cooling.

3. The LES device of claim 1 wherein the metal interconnect structure comprises a plurality of copper traces formed on the flexible dielectric film.

4. The LES device of claim 1 wherein the metal interconnect structure is patterned so as to include openings therein corresponding to locations of the light emitting area of each respective LES chip.

5. The LES device of claim 1 wherein the heatsink is configured to function as an anode connection or a cathode connection in the LES device.

6. The LES device of claim 1 wherein heat generated by the array of LES chips is transmitted to the heatsink for heat dissipation.

7. The LES device of claim 1 further comprising one of an electrically conductive solder material, an electrically conductive adhesive, and sintered silver, included between the heatsink and the array of LES chips to secure the array of LES chips to the heatsink.

8. The LES device of claim 1 wherein the flexible dielectric film is configured to adhere to the array of LES chips.

9. The LES device of claim 1 wherein the flexible interconnect structure is free of wirebond connections.

10. The LES device of claim 1 wherein the flexible dielectric film includes a plurality of openings formed therein corresponding to locations of the light emitting area of each respective LES chip.

11. The LES device of claim 1 wherein the flexible dielectric film comprises a transparent film configured to permit light emitted from the light emitting area of each respective LES chip to pass therethrough.

12. The LES device of claim 1 wherein the connection pads are formed on the front surface of the LES chips, and wherein the flexible interconnect structure is positioned on the front surface of the LES chips.

13. The LES device of claim 1 wherein the metal interconnect structure comprises a reflective film coated on an outer surface thereof, the reflective film configured to a increase a spectral reflectance of the metal interconnect structure so as to maximize reflection and reduce optical losses in the LES device.

14. A light emitting semiconductor (LES) device comprising:
 a heatsink;
 an array of LES chips mounted on the heatsink and electrically connected thereto, each LES chip comprising a front surface and a back surface, with the front surface including a light emitting area configured to emit light therefrom responsive to a received electrical power and with at least one of the front surface and the back surface including connection pads thereon; and
 a flexible interconnect structure positioned on and electrically connected to each LES chip to provide for controlled operation of the array of LES chips, the flexible interconnect structure comprising:
  a flexible dielectric film configured to conform to a shape of the heatsink; and
  a metal interconnect structure formed on the flexible dielectric film, the metal interconnect structure extending through vias formed through the flexible dielectric film so as to form direct metallic and electrical connections with the connection pads of the LES chips;
 wherein the connection pads are formed on the back surface of the LES chips, and wherein the flexible interconnect structure is positioned on the back surface of the LES chips, with the metal interconnect structure electrically connecting the LES chips and the heatsink and comprising a heat spreader between the LES chips and the heatsink.

15. A multidirectional lighting device comprising:
 a heatsink having a curved profile;
 an array of light emitting semiconductor (LES) chips affixed to the heatsink so as to be electrically connected thereto, the array of LES chips being arranged so as to have a curved profile that substantially matches that of the heatsink, and wherein each LES chip comprises a front surface including a connection pad and a light emitting area configured to emit light therefrom responsive to a received electrical power; and a flexible interconnect structure positioned on the array of LES chips and being electrically connected to each of the LES chips, the flexible interconnect structure comprising:
- a flexible dielectric film configured to conform to the curved profile of the array of LES chips; and
- a metal interconnect structure formed on the flexible dielectric film, the metal interconnect structure extending through vias formed through the flexible dielectric film so as to be electrically connected to the connection pads of the LES chips.

16. The multidirectional lighting device of claim 15 wherein the metal interconnect structure comprises a plurality of copper traces formed on the flexible dielectric film.

17. The multidirectional lighting device of claim 15 wherein the flexible dielectric film includes a plurality of openings formed adjacent locations of the light emitting area of each respective LES chip, and wherein the metal interconnect structure is patterned so as to include openings therein corresponding to the openings of the flexible dielectric film.

18. The multidirectional lighting device of claim 15 wherein the heatsink is configured to function as one of a cathode connection and an anode connection in the LES device.

19. The multidirectional lighting device of claim 15 further comprising an electrically conductive material included between the heatsink and the array of LES chips to secure the array of LES chips to the heatsink.

20. The multidirectional lighting device of claim 15 wherein the heatsink is constructed to have a circular shape such that the array of LES chips mounted thereon are arranged to emit light over a 360 degree coverage area.

21. The multidirectional lighting device of claim 15 wherein the an array of LES chips is affixed directly to the heatsink without the use of an insulated metal substrate (IMS) therebetween, and wherein the flexible interconnect structure is free of wirebond connections.

22. The multidirectional lighting device of claim 15 wherein the flexible interconnect structure is positioned on a back surface of the array of LES chips, between the array of LES chips and the heatsink; and
wherein the flexible interconnect structure is configured to electrically connect the array of LES chips to the heatsink and function as a heat spreader between the array of LES chips and the heatsink.

23. A method of forming a light emitting semiconductor (LES) device comprising:
providing a plurality of LES chips, with the plurality of LES chips forming an LES array, and wherein each LES chip comprises a front surface having a light emitting area configured to emit light therefrom responsive to a received electrical power;
connecting a flexible dielectric film to each of the plurality of LES chips in the LES array, the flexible dielectric film configured to flex so as to conform substantially to the profile of the LES array;
forming a metal interconnect structure on the flexible dielectric film to electrically connect the plurality of LES chips, the metal interconnect structure extending through vias in the flexible dielectric film so as to form direct metallic and electrical connections with contact pads of the LES chips; and
securing the plurality of LES chips to a heatsink, such that the plurality of LES chips is electrically connected to the heatsink and such that the LES array has a profile that matches a profile of the heatsink;
wherein the heatsink has a curved, non-planar profile and wherein the LES array has a corresponding curved, non-planar profile, such that the LES array is configured to emit light in a multidirectional pattern.

24. The method of claim 23 wherein securing the plurality of LES chips on the heatsink comprises solder attaching the plurality of LES chips to the heatsink.

25. The method of claim 23 further comprising forming a plurality of openings in the flexible dielectric film adjacent locations of the light emitting area of each respective LES chip.

26. A light emitting semiconductor (LES) device comprising:
a heatsink;
an array of LES chips mounted on the heatsink and electrically connected thereto, each LES chip comprising a front surface and a back surface, with the front surface including a light emitting area configured to emit light therefrom responsive to a received electrical power and with at least one of the front surface and the back surface including connection pads thereon; and
a flexible interconnect structure positioned on and electrically connected to each LES chip to provide for controlled operation of the array of LES chips, the flexible interconnect structure comprising:
- a flexible dielectric film configured to conform to a shape of the heatsink; and
- a metal interconnect structure formed on the flexible dielectric film, the metal interconnect structure extending through vias formed through the flexible dielectric film so as to form direct metallic and electrical connections with the connection pads of the LES chips;
wherein the flexible dielectric film comprises a first surface and a second surface;
wherein the metal interconnect structure is formed on the first surface of the flexible dielectric film;
wherein the LES chips are positioned on the second surface of the flexible dielectric film; and
wherein the metal interconnect structure extends from the first surface of the flexible dielectric film through the vias formed through the flexible dielectric film to the second surface of the flexible dielectric film.

* * * * *